United States Patent
Weling

[11] Patent Number: 6,114,246
[45] Date of Patent: *Sep. 5, 2000

[54] METHOD OF USING A POLISH STOP FILM TO CONTROL DISHING DURING COPPER CHEMICAL MECHANICAL POLISHING

[75] Inventor: Milind Weling, San Jose, Calif.

[73] Assignee: VLSI Technology, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/227,034

[22] Filed: Jan. 7, 1999

[51] Int. Cl.$^7$ .................................................. H01L 21/302
[52] U.S. Cl. .......................... 438/691; 438/692; 438/699; 438/700; 438/745; 438/754
[58] Field of Search .................................. 438/692, 690, 438/693, 695, 699, 754, 745, 751, 756, 785, 700, 691

[56] References Cited

U.S. PATENT DOCUMENTS

| | | | |
|---|---|---|---|
| 5,356,513 | 10/1994 | Burke et al. | 438/633 |
| 5,380,546 | 1/1995 | Krishnan et al. | 427/126.1 |
| 5,510,645 | 4/1996 | Fitch et al. | 257/522 |
| 5,510,652 | 4/1996 | Burke et al. | 257/752 |
| 5,618,381 | 4/1997 | Doan et al. | 438/633 |
| 5,665,202 | 9/1997 | Subramanian et al. | 438/692 |
| 5,676,587 | 10/1997 | Landers et al. | 451/57 |

*Primary Examiner*—Benjamin L. Utech
*Assistant Examiner*—Binh Tran
*Attorney, Agent, or Firm*—Wagner, Murabito & Hao LLP

[57] ABSTRACT

A method of using polish stop film to control dishing during copper chemical mechanical polishing. In one embodiment, the method comprises several steps. One step involves depositing a polish stop layer above a metal layer disposed on a semiconductor wafer. Another step involves placing the semiconductor wafer onto a polishing pad of a chemical mechanical polishing machine. A further step involves removing the metal layer of the semiconductor wafer and also preferentially removing the polish stop layer using a chemical mechanical polishing process. The benefit of the polish stop layer is to prevent dishing of the metal layer within the trench. Another step involves ceasing the chemical mechanical polishing process when the metal layer is removed from desired areas of the semiconductor wafer and the semiconductor wafer is substantially planar.

8 Claims, 10 Drawing Sheets

METHOD OF USING A POLISH STOP FILM TO CONTROL DISHING DURING COPPER CHEMICAL MECHANICAL POLISHING

TECHNICAL FIELD

The field of the present invention pertains to semiconductor fabrication processes. More particularly, the present invention relates to the field of chemical mechanical polishing of metal lines in a semiconductor wafer.

BACKGROUND ART

Most of the power and usefulness of today's digital integrated circuit (IC) devices can be attributed to the increasing levels of integration. More and more components (resistors, diodes, transistors, and the like) are continually being integrated into the underlying chip, or IC. The starting material for typical ICs is very high purity silicon. The material is grown as a single crystal. It takes the shape of a solid cylinder. This crystal is then sawed (like a slice of bread) to produce wafers typically 10 to 30 cm in diameter and 250 microns thick.

The geometry of the features of the IC components is commonly defined photographically through a process known as photolithography. Very fine surface geometry can be reproduced accurately by this technique. The photolithography process is used to define component regions and build up components one layer on top of another. Complex ICs can often have many different built up layers, each layer having components, each layer having differing interconnections, and each layer stacked on top of the previous layer. The resulting topography of these complex IC's often resemble familiar terrestrial "mountain ranges," with many "hills" and "valleys" as the IC components are built up on the underlying surface of the silicon wafer.

In the photolithography process, a mask image, or pattern, defining the various components, is focused onto a photosensitive layer using incident light. The image is focused onto the surface using the optical means of the photolithography tool, and is imprinted into the photosensitive layer. To build ever-smaller features, increasingly fine images must be focused onto the surface of the photosensitive layer, i.e. optical resolution must increase. As optical resolution increases, the depth of focus of the mask image correspondingly narrows. This is due to the narrow range in depth of focus imposed by the high numerical aperture lenses in the photolithography tool. This narrowing depth of focus is often the limiting factor in the degree of resolution obtainable, and thus, the smallest components obtainable using the photolithography tool. The extreme topography of complex ICs, the "hills" and "valleys," exaggerate the effects of decreasing depth of focus. Thus, in order to properly focus the mask image defining sub-micron geometries onto the photosensitive layer, a precisely flat surface is desired. The precisely flat (i.e., fully planarized) surface will allow for extremely small depths of focus, and in turn, allow the definition and subsequent fabrication of extremely small components.

Chemical mechanical polishing (CMP) is a preferred method of obtaining full planarization of a semiconductor wafer. It involves removing a sacrificial layer of dielectric material using mechanical contact between the wafer and a moving polishing pad saturated with slurry. Polishing flattens out height differences, since high areas of topography (hills) are removed faster than areas of low topography (valleys). Polishing is the only technique with the capability of smoothing out topography over millimeter scale planarization distances leading to maximum angles of much less than one degree after polishing.

Figure 1:
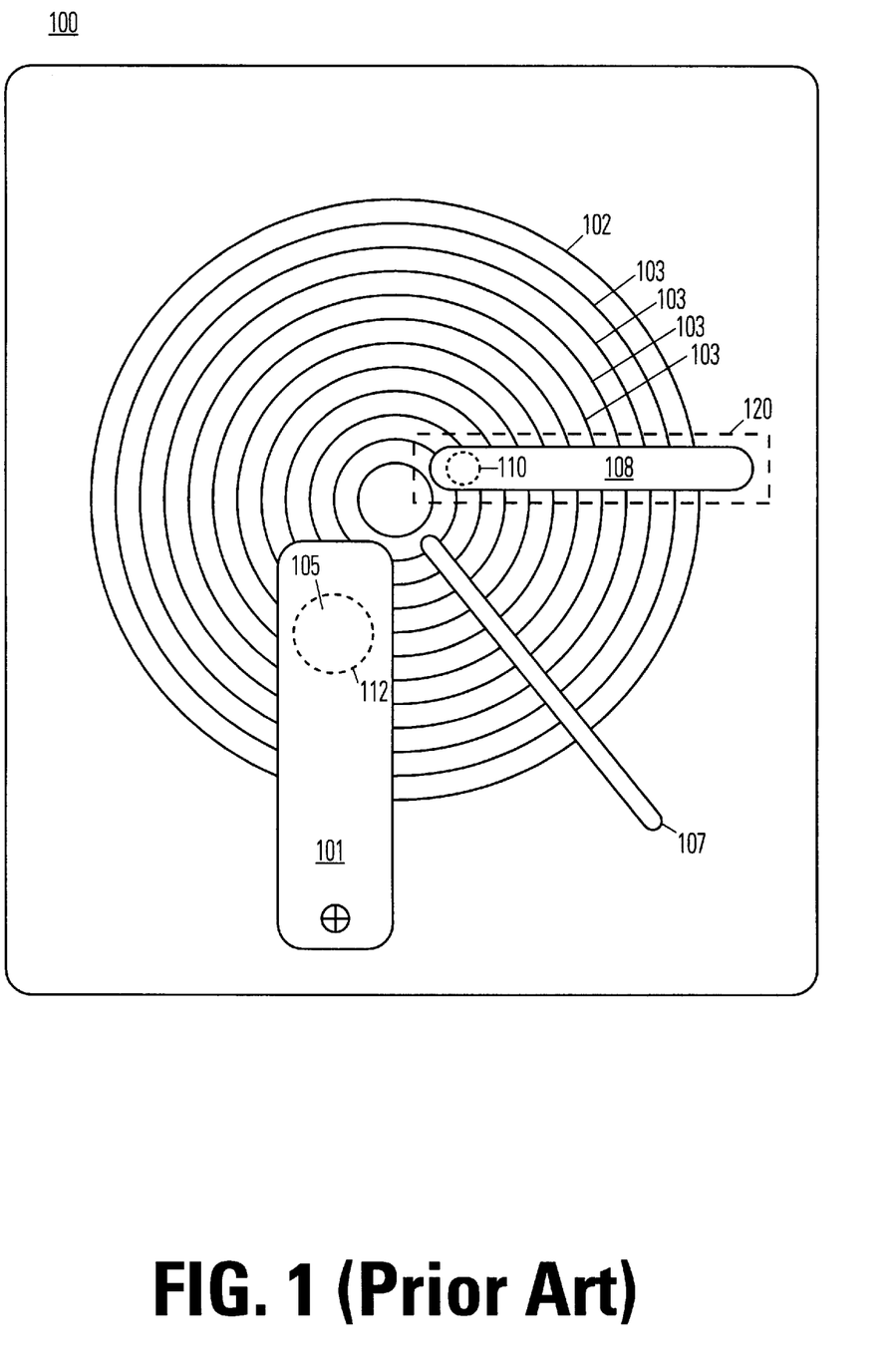
FIG. 1 is a top view of a prior art chemical mechanical polishing machine.
Figure 2:
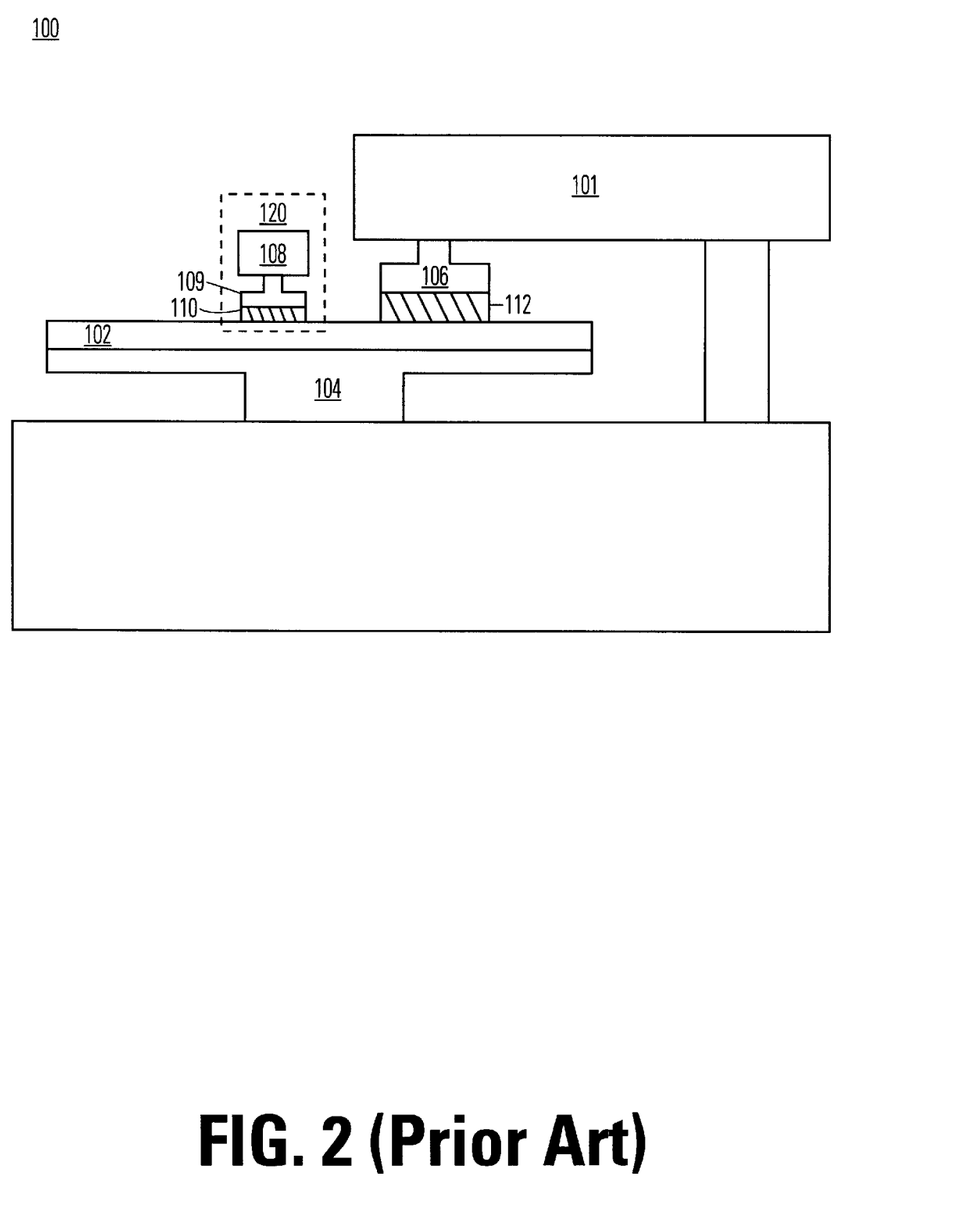
FIG. 2 is a side view of the prior art chemical mechanical polishing machine of Prior Art FIG. 1.

FIG. 1 is a top view of a chemical mechanical polishing (CMP) machine 100 and FIG. 2 is a side view of CMP machine 100. CMP machine 100 is fed semiconductor wafers to be polished. CMP machine 100 picks up the wafers with an arm 101 and places them onto a rotating polishing pad 102. Polishing pad 102 is made of a resilient material and is textured, often with a plurality of predetermined grooves 103, to aid the polishing process. Polishing pad 102 rotates on a platen 104, or turntable located beneath polishing pad 102, at a predetermined speed. A wafer 105 is held in place on polishing pad 102 within a carrier ring 112 that is connected to a carrier film 106 of arm 101. The front surface of wafer 105 rests against polishing pad 102. The back surface of wafer 105 is against the lower surface of carrier film 106 of arm 101. As polishing pad 102 rotates, arm 101 rotates wafer 105 at a predetermined rate. Arm 101 forces wafer 105 into polishing pad 102 with a predetermined amount of down force. CMP machine 100 also includes a slurry dispense arm 107 extending across the radius of polishing pad 102, which dispenses a flow of slurry onto polishing pad 102.

The slurry is a mixture of deionized water and polishing agents designed to chemically aid the smooth and predictable planarization of wafer 105. The rotating action of both polishing pad 102 and wafer 105, in conjunction with the polishing action of the slurry, combine to planarize, or polish, wafer 105 at some nominal rate. This rate is referred to as the removal rate. A constant and predictable removal rate is important to the uniformity and throughput performance of the wafer fabrication process. The removal rate should be expedient, yet yield precisely planarized wafers, free from surface anomalies. If the removal rate is too slow, the number of planarized wafers produced in a given period of time decreases, hurting wafer throughput of the fabrication process. If the removal rate is too fast, the CMP planarization process will not be consistent across several wafers in a batch, thereby hurting the consistency of the fabrication process.

To aid in maintaining a stable removal rate, CMP machine 100 includes a conditioner assembly 120. Conditioner assembly 120 includes a conditioner arm 108, which extends across the radius of polishing pad 102. An end effector 109 is connected to conditioner arm 108. End effector 109 includes an abrasive conditioning disk 110 that is used to roughen the surface of polishing pad 102. Conditioning disk 110 is rotated by conditioner arm 108 and is transitionally moved towards the center of the polishing pad 102 and away from the center of polishing pad 102, such that conditioning disk 110 covers the radius of polishing pad 102. In so doing, conditioning disk 110 covers the surface area of polishing pad 102, as polishing pad 102 rotates. A polishing pad having a roughened surface has an increased number of micro-pits and gouges in its surface from conditioner assembly 120 and therefore produces a faster removal rate via increased slurry transfer to the surface of wafer 105. Without conditioning, the surface of polishing pad 102 is smoothed during the polishing process and removal rate decreases dramatically. Conditioner assembly 120 re-roughens the surface of polishing pad 102, thereby improving the transport of slurry and improving the removal rate.

As described above, the CMP process uses abrasive slurry on a polishing pad. The polishing action of the slurry is comprised of an abrasive frictional component and a chemical component. The abrasive frictional component is due to the friction between the surface of the polishing pad, the surface of the wafer, and the abrasive particles suspended in the slurry. The chemical component is due to the presence in the slurry of polishing agents that chemically interact with the material of the dielectric layer of wafer 105. The chemical component of the slurry is used to soften the surface of the dielectric layer to be polished, while the frictional component removes material from the surface of wafer 105.

Referring still to FIGS. 1 and 2, the polishing action of the slurry determines the removal rate and removal rate uniformity, and thus, the effectiveness of the CMP process. As slurry is "consumed" in the polishing process, the transport of fresh slurry to the surface of wafer 105 and the removal of polishing by-products away from the surface of wafer 105 becomes very important in maintaining the removal rate. Slurry transport is facilitated by the texture of the surface of polishing pad 102. This texture is comprised of both predefined grooves 103 and micro-pits that are manufactured into the surface of polishing pad 102 and the inherently rough surface of the material from which polishing pad 102 is made.

The slurry is transported by grooves 103 and micro-pits of polishing pad 102 under the edges of wafer 105 as both polishing pad 102 and wafer 105 rotate. Consumed slurry and polishing by-products, in a similar manner, are also transported by grooves 103 and micro-pits of polishing pad 102 away from the surface of wafer 105. As the polishing process continues, fresh slurry is continually dispensed onto polishing pad 102 from slurry dispense arm 107. The polishing process continues until wafer 105 is sufficiently planarized and removed from polishing pad 102.

It should be appreciated that the CMP process described above is used as part of the fabrication of metal lines within a semiconductor wafer. For instance, to couple the various discrete components of a circuit, a conductor pattern is constructed between the components formed on the wafer. The conductor pattern is formed in a manner similar to that used to form the semiconductor devices. Oxidation is used to create a dielectric layer to isolate the conductor from the semiconductor portion of the wafer. Etching is used to define trenches for conductors. Chemical or physical vapor deposition is used to deposit a metal (e.g., copper) layer on the dielectric layer. Finally, chemical mechanical polishing (CMP) is typically used to remove the layer of metal from specific areas, usually the non-trench areas of the wafer that are not designed to be conductors. However, after the polishing operation, metal still remains within the trenches. The resultant product is a semiconductor wafer with metal-filled trenches that couple components. In this way, current is only conducted through the conducting metal line in the trenches between desired components in an IC circuit. The dielectric layer surrounding the trench prevents current leakage and short-circuits.

Figure 3A:
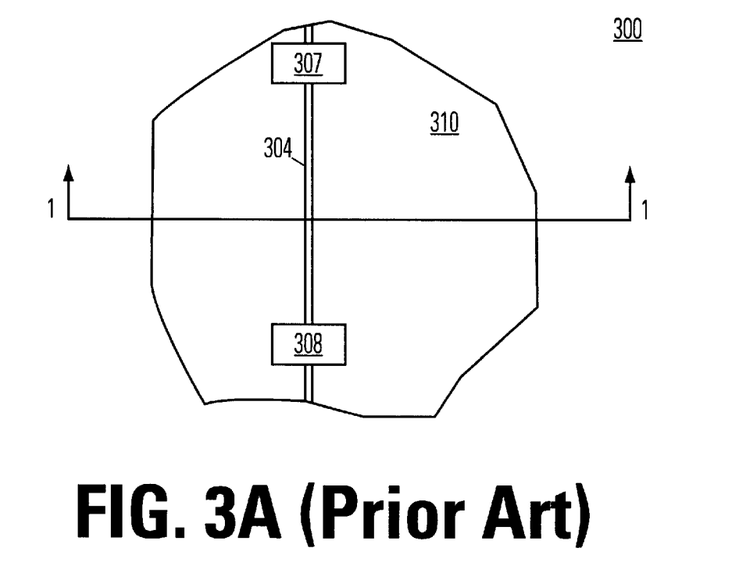
FIG. 3A is a top view of a conventional prior art semiconductor wafer having a trench within a dielectric layer.

The following figures present the conventional prior art process for fabricating copper lines within a semiconductor wafer. As mentioned above, a pattern of trenches is defined within a dielectric layer as part of the prior art process of forming copper lines to electrically couple various discrete components. Prior art FIG. 3A is a top view of a semiconductor wafer 300 having a trench 304 defined within a dielectric layer 310 to eventually couple electronic components 307 and 308 electrically. A typical integrated circuit (IC) is made up of many electronic components that have many trenches formed between them. However, for simplicity, only trench 304 and electronic components 307 and 308 are shown.

Figure 3B:
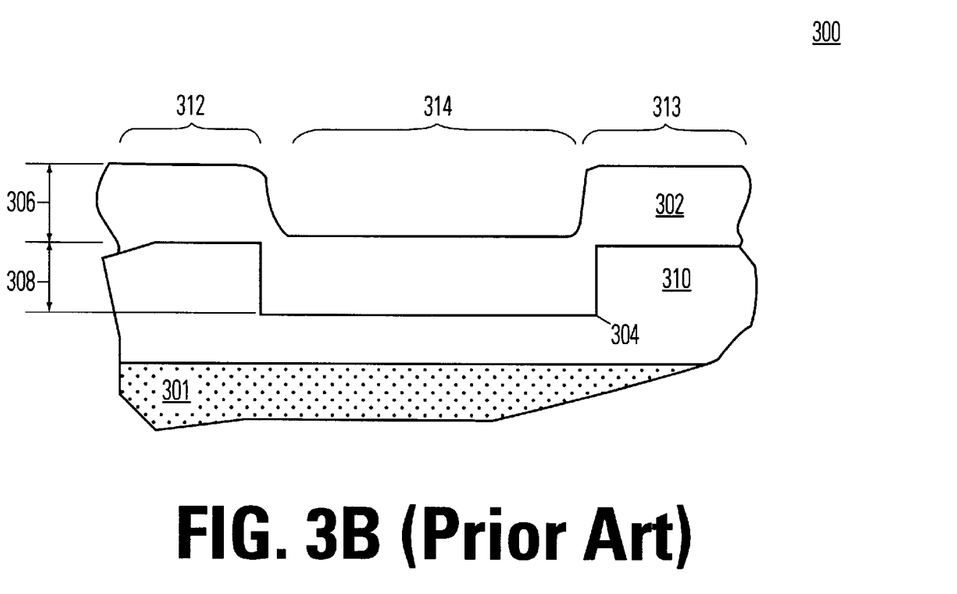
FIG. 3B is a side sectional view of the conventional prior art semiconductor wafer of Prior Art FIG. 3A, after a layer of copper was deposited above its dielectric layer.

Prior art FIG. 3B is a side sectional view of semiconductor wafer 300, along line 1—1 of FIG. 3A, after a layer of copper 302 is deposited above dielectric layer 310. It should be appreciated that dielectric layer 310 is deposited above a semiconductor substrate 301. Furthermore, dielectric layer 310 has a trench 304 formed therein. As such, copper layer 302 fills in trench 304 as it covers dielectric layer 310. Typically, a copper chemical mechanical polishing process is then used to remove copper layer 302 from areas 312 and 313 of semiconductor wafer 300. Furthermore, the copper CMP process is also used to planarize the upper surface of copper layer 302 remaining within trench 304. Following the copper CMP process, copper layer 302 ideally remains only within trench 304.

Figure 3C:
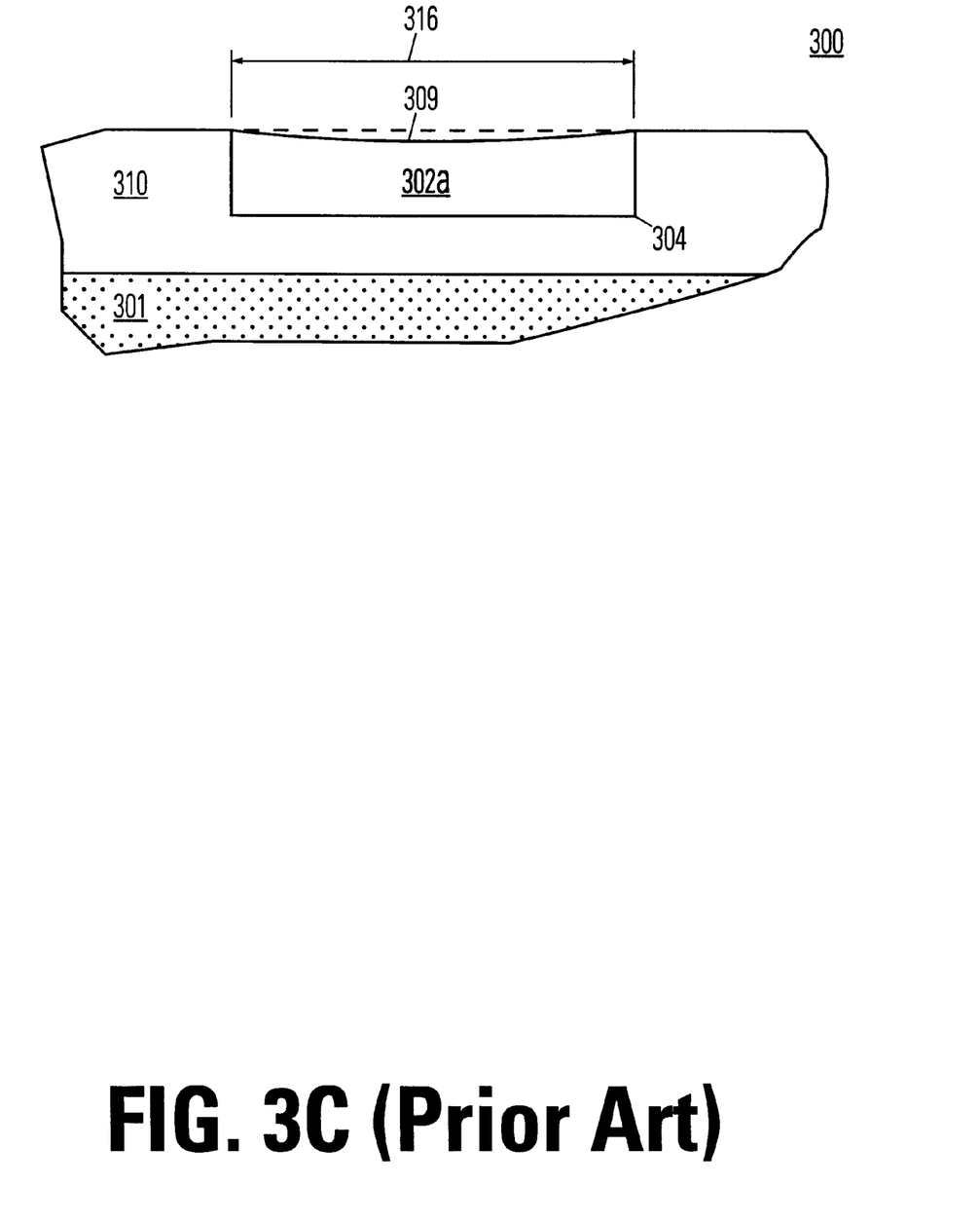
FIG. 3C is a side-sectional view of the semiconductor wafer of Prior Art FIG. 3B following a conventional prior art copper CMP process.

Prior art FIG. 3C illustrates semiconductor wafer 300 following the CMP process to remove copper layer 302 from areas 312 and 313, thereby leaving a copper line 302a within trench 304. Unfortunately, there are disadvantages associated with the prior art copper line fabrication process described above. One of the main disadvantages is that it typically results in a dished, or concave, surface 309, of copper line 302a. Specifically, the copper CMP process is implemented to expressly remove material from copper layer 302. As such, the copper CMP process removes material from copper layer 302 faster than it removes material from dielectric layer 310, resulting in dished surface 309. It should be appreciated that the dishing of surface 309 increases as the width 316 of trench 304 increases.

The resultant dished surface 309 of copper line 302a yields a variable resistance within copper line 302a. Specifically, variations of the cross-sectional area of copper line 302a between electronic components 307 and 308 of FIG. 3A create a variable metal (sheet) resistance within copper line 302a. The variable resistance affects the timing and the voltage level of the signals transferred between electronic components 107 and 108. Variation in the timing and the voltage of the signals transferred between components 107 and 108 have a subsequent effect on the overall IC performance. Timing and voltage levels affect interaction between parallel and serial circuitry in the IC and their respective logic levels. Consequently, a need exists for a method and system for providing copper lines within a semiconductor wafer that do not have dished surfaces.

While it is not shown in Prior Art FIGS. 3A, 3B, or 3C, it is appreciated that within the prior art, a barrier (seed) layer, of material is deposited on the surfaces that form trench 304 prior to depositing copper layer 302. The barrier layer prevents copper layer 302 from diffusing into dielectric layer 310. The same or different barrier layer is also typically deposited on top of copper line 302a to prevent copper line 302a from diffusing into subsequent layers deposited on top of it. Within the prior art, a deposition of a barrier layer on top of copper line 302a is a discrete operation following the copper CMP process described above. As such, a specific amount of fabrication steps are utilized to fabricate and encapsulate copper line 302a within barrier layers. Hence, a need exists for a method and system that does not require additional fabrication steps to provide copper lines within a semiconductor wafer that do not have dished surfaces and are also encapsulated within barrier layers.

Thus, a need exists for a method and system for providing copper lines within a semiconductor wafer that do not have dished surfaces. A further need exists for a method and system which meets the above need but which does not require additional fabrication steps to encapsulate the copper lines of the semiconductor wafer within barrier layers.

DISCLOSURE OF THE INVENTION

The present invention provides a method and system for providing copper lines within a semiconductor wafer that are free of dished surfaces. Furthermore, the present invention provides a method and system which meets the above need and enables encapsulation of the copper lines of the semiconductor within barrier layers without using additional fabrication steps.

Specifically, one embodiment of the present invention includes a method for improving chemical mechanical polishing of metal deposited on a semiconductor wafer in order to form metal lines. One step in this method includes depositing a polish stop layer above a metal layer disposed on a semiconductor wafer. Another step is placing the semiconductor wafer onto a polishing pad of a chemical mechanical polishing machine. A further step involves removing material from the polish stop layer and the metal layer of the semiconductor wafer using a chemical mechanical polishing process. Beneficially, the polish stop layer reduces the dishing effect of the metal layer located in the trench. Another step involves ceasing the chemical mechanical polishing process when the polish stop layer and the metal layer are removed from desired areas of the semiconductor wafer and the semiconductor wafer is substantially planar.

Another embodiment of the present invention includes the steps of the method described above wherein the metal (e.g., copper) layer is deposited to a thickness less than the depth of the trench. Furthermore, the polish stop layer in this embodiment has a thickness approximately equal to the quotient of the depth of the trench divided by polishing selectivity value. The sum of said metal layer thickness and the polish stop layer thickness is approximately equal to the depth of the trench. The specific thicknesses of the metal layer and polish stop layer ensure that the metal layer located in the trench is still covered by the polish stop layer when the CMP process is finished. In this manner, the polish stop layer acts as a barrier layer for the metal (e.g., copper) layer within the trench without using additional fabrication steps.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

PRIOR ART

PRIOR ART

PRIOR ART

PRIOR ART

PRIOR ART

FIG. 5B is a side sectional view of the semiconductor wafer of FIG. 5A after completion of the CMP process resulting in a barrier layer, in accordance with one embodiment of the present invention.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

The following detailed description presents the method, and resultant apparatus, of forming in a semiconductor wafer, a copper line having a substantially flat and non-dished surface. The method and apparatus are presented and described first, followed by a more generalized flowchart of the steps involved in the present invention.

METHOD FOR FORMING A FLAT COPPER LINE IN WAFER

Figure 4A:
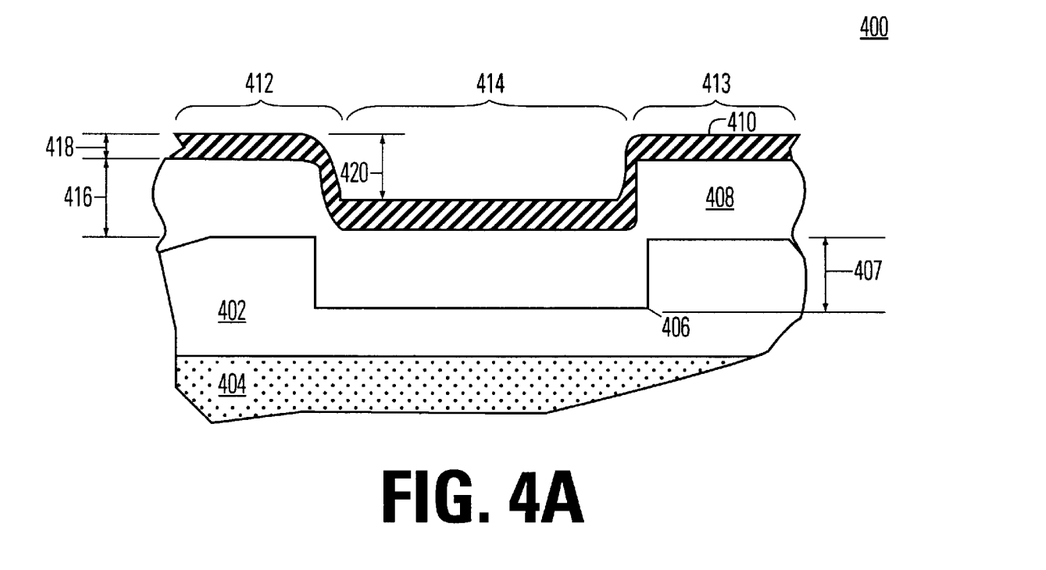
FIG. 4A is a side-sectional view of a semiconductor wafer after a copper layer and a polish stop layer are deposited in accordance with one embodiment of the present invention.

FIG. 4A is a side sectional view of a semiconductor wafer 400. A dielectric layer 402, disposed above a semiconductor substrate 404, has a trench 406 formed therein. A copper layer 408 is disposed above dielectric layer 402. A polish stop layer 410 is then deposited above copper layer 408. Because copper layer 408 and polish stop layer 410 are deposited over an uneven surface due to trench 406, copper layer 408 and polish stop layer 410 subsequently have high topographical areas 412 and 413, and low topographical area 414. It should be appreciated that within the present embodiment copper layer 408 can be comprised of other types of metals (e.g., aluminum, silver, and the like).

While the present embodiment specifies trench 406 formed within dielectric layer 402, the present embodiment is equally suited to have trench 406 formed within other materials (e.g., substrate 404). Furthermore, while layers of specific material have been deposited on top of each other, the present invention is well suited to layers of different materials as well as additional layers besides those described herein.

Within the present embodiment, the thickness 416 of copper layer 408 is no less than depth 407 of trench 406 and hence completely fills trench 406. It should be appreciated that within the present embodiment, thickness 418 of polish stop layer 410 is approximately equal to the quotient of depth 407 of trench 406 divided by a polishing selectivity value (defined below). It should be further appreciated that polish stop layer 410 of the present embodiment is composed of tantalum. In another embodiment, polish stop layer 410 is composed of tantalum nitride. While the present embodiment utilizes a specific material for polish stop layer 410, the present embodiment is equally suited to similar materials that exhibit polish rates less than that of copper layer 408. Additionally, the present embodiment is also well suited to a variety of polish stop layers having a variety of thicknesses, as required for individual applications.

The polishing selectivity value of polish stop film 410 is important to the present embodiment. The polishing selectivity value refers to the relative chemical mechanical polishing rate of polish stop film 410 as compared to that of copper layer 408. In other words, polish stop film 410 polishes at a slower rate than the copper layer 408 if the polishing selectivity value is greater than 1. As such, wherever polish stop film 410 remains during the copper CMP process described above, it provides a protective layer above copper layer 408. Within the present embodiment, the polishing selectivity value of polish stop film 410 is between values of 8 and 12, inclusive. In this manner, polish stop layer offers a protective layer approximately one-tenth the polish rate of copper layer. It should be appreciated that within the present embodiment the polishing selectivity value of polish stop film 410 can be a wide range of values.

Figure 4B:
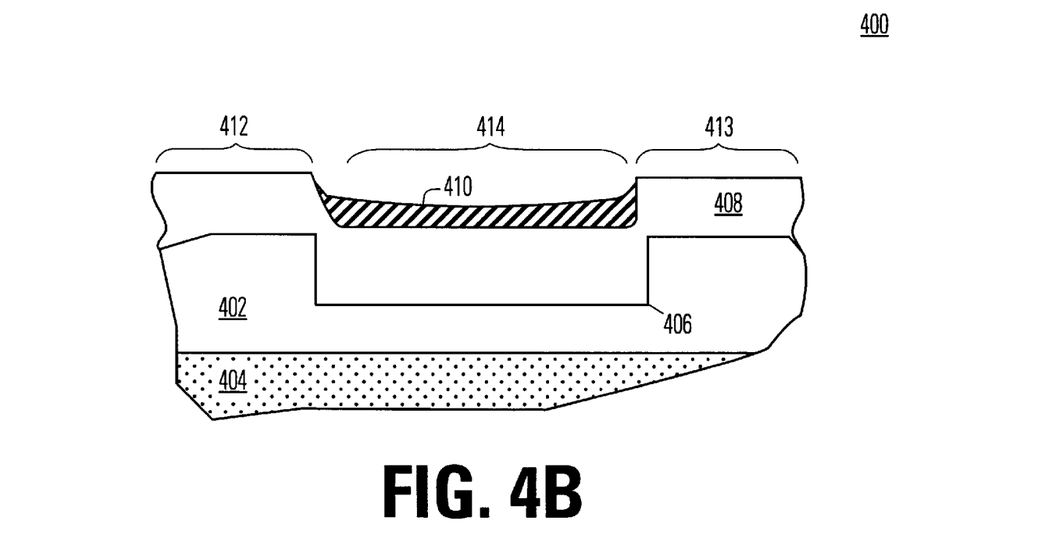
FIG. 4B is a side sectional view of the semiconductor wafer of FIG. 4A midway through a copper CMP process, in accordance with one embodiment of the present invention.

Referring now to FIG. 4B, the dynamics of the copper CMP process of semiconductor wafer 400 of FIG. 4A will now be described. FIG. 4B illustrates semiconductor wafer 400 midway through the copper CMP process, which is well known by those of ordinary skill in the art. Initially, the polishing pad of a CMP machine typically only polishes against high topographical areas 412 and 413 of a semiconductor wafer 400. However, as high topographical areas 412 and 413 are polished down, the polishing pad will eventually contact polish stop layer 410 within low topographical area 414. This usually occurs when polish stop layer 410 has been removed from high topographical area 412 and 413, but still exists within low topographical area 414. As such, polish stop layer 410 located within low topographical area 414 provides a protective layer for copper layer 408 that exists within trench 406 during the copper CMP process. In other words, during the copper CMP process, material is removed more quickly from copper layer 408 within high topographical areas 412 and 413 than is removed from polish stop layer 410 remaining within low topographical area 414. Therefore, copper layer 408 within trench 406 is protected from extended exposure to the copper CMP process that can result in the dishing of its surface.

The copper CMP process is stopped when copper layer 408 is removed from desired areas of semiconductor wafer 400 and it is substantially planar.

Figure 4C:
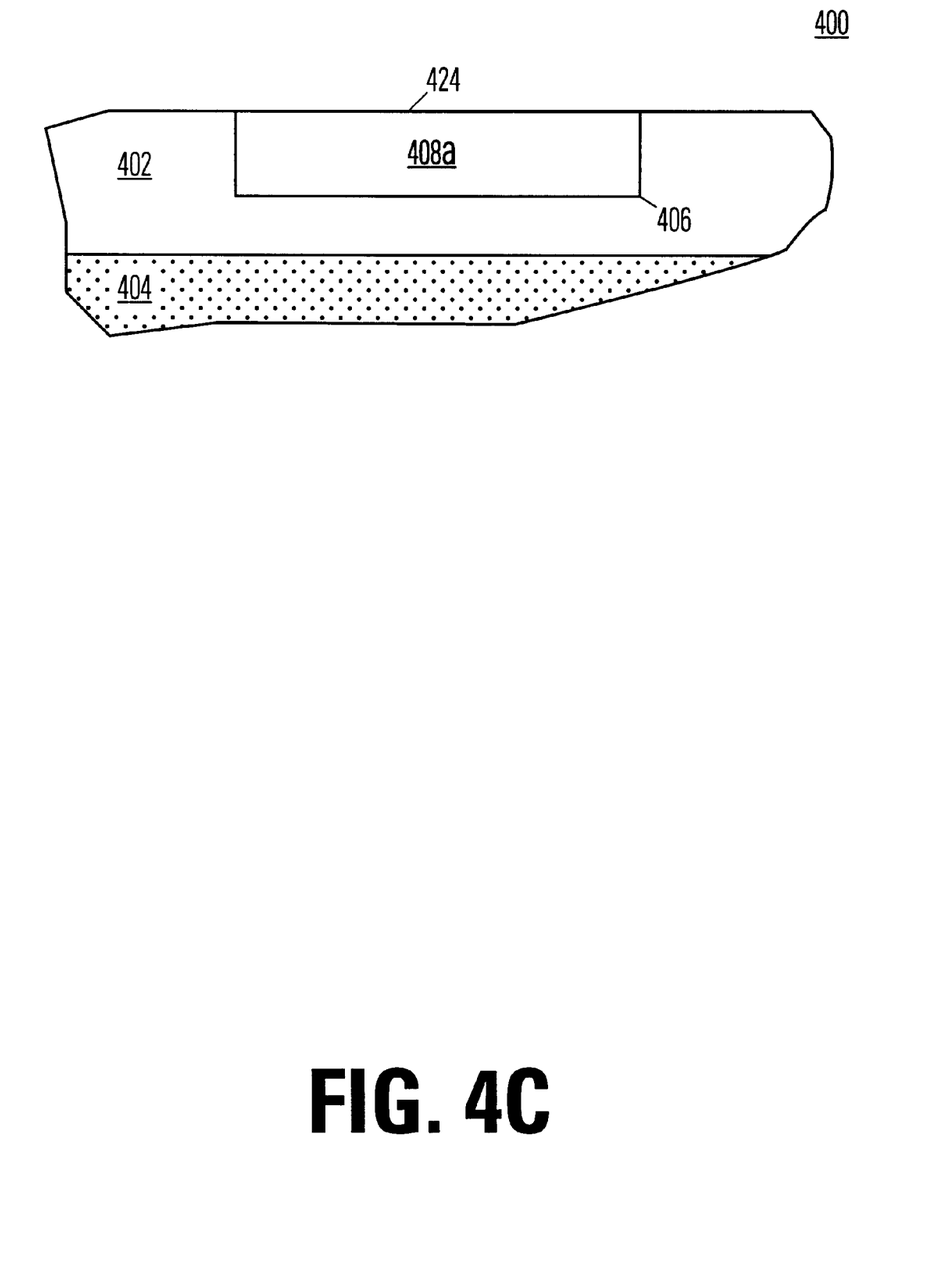
FIG. 4C is a side sectional view of the semiconductor wafer of FIG. 4A after completion of the copper CMP process in accordance with one embodiment of the present invention.

FIG. 4C presents a side sectional view of semiconductor wafer 400 after completion of the copper CMP process to remove copper layer 408 and polish stop layer 410 from specific areas of semiconductor wafer 400. As shown, copper line 408*a* has a substantially flat and non-dished surface 424. Consequently, copper line 408*a* in the present embodiment has a consistent cross-sectional area thereby providing a constant resistance along its length. As a result, the operation of an IC utilizing copper line 408*a* of the present embodiment provides more reliable and consistent data signal transmission.

While it is not shown in FIGS. 4A or 4B, it should be appreciated that a barrier (seed) layer of material is typically deposited on the bottom and sides of trench 406 prior to depositing copper layer 408. This barrier layer prevents copper line 408*a* from diffusing into dielectric layer 402.

Figure 5A:
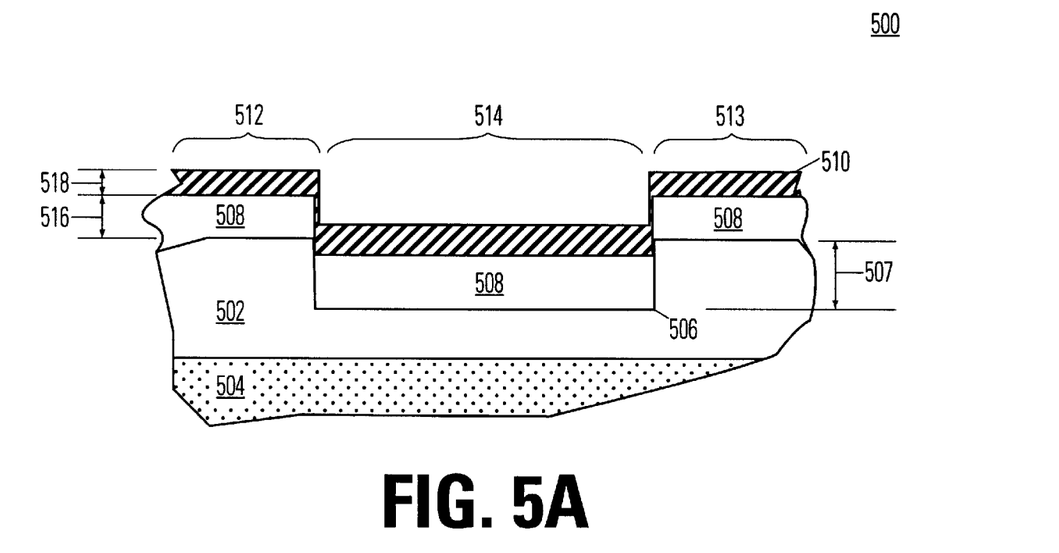
FIG. 5A is a side sectional view of a semiconductor wafer after a copper layer and a polish stop layer are deposited in accordance with one embodiment of the present invention.

FIG. 5A is a side sectional view of a semiconductor wafer 500. In this embodiment, copper layer 508 and polish stop layer 510 are deposited in such a manner as to leave a residual portion of polish stop layer 510 above copper layer 508 following completion of copper CMP operation. In this way, the residual portion of polish stop layer 510 acts as a barrier layer over copper layer 508 without requiring additional fabrication steps.

More specifically, FIG. 5A shows dielectric layer 502, disposed above semiconductor substrate 504, with trench 506 formed therein. A copper layer 508 and a polish stop layer 510 are deposited above dielectric layer 502. Because copper layer 508 and polish stop layer 510 are deposited over an uneven surface due to trench 506, copper layer 508 and polish stop layer 510 subsequently have high topographical areas 512 and 513, and a low topographical area 514.

While the present embodiment specifies trench 506 in dielectric layer 502, the present invention is equally suited to obtaining a planar and non-dishing surface on any surface that has an uneven topographical area. It should be appreciated that within the present embodiment, copper layer 508 can be comprised of other types of metals (e.g., aluminum, silver, and the like).

While the present embodiment specifies trench 506 formed within dielectric layer 502, the present embodiment is equally suited to have trench 506 formed within other materials (e.g., substrate 504, etc.). Furthermore, while layers of specific materials have been deposited on top of each other, the present embodiment is well suited to layers of different materials as well as additional layers besides those described herein.

It should be further appreciated that polish stop layer 510 of the present embodiment is composed of tantalum. In another embodiment, polish stop layer 510 is composed of tantalum nitride. While the present embodiment utilizes a specific material for polish stop layer 510, the present embodiment is equally suited to similar materials that exhibit polish rates less than that of copper layer 508. Additionally, the present embodiment is also well suited to a variety of polish stop layers having a variety of thicknesses, as required for individual applications.

Within the present embodiment, the thickness 516 of copper layer 508 is less than depth 507 of trench 506 so as to provide space within trench 506 for a layer of polish stop film 510. It should be appreciated that within the present embodiment, thickness 518 of polish stop layer 510 is approximately equal to the depth 507 of trench 506 minus the thickness of copper layer deposited. The relative thickness of copper layer 508 and polish stop layer 510 can be varied over a wide range of values depending on the specific application. In this embodiment, thickness 518 of polish stop layer 510 is approximately equal to the quotient of depth 507 of copper layer 506 divided by a polishing selectivity value. Also in this embodiment, the sums of thickness 516 of copper layer 508 and thickness 518 of polish stop layer 510 is approximately equal to depth 507 of trench 506. With this unique combination of thicknesses, a barrier layer will be formed within trench 506 after a copper CMP process as shown in subsequent figures.

Figure 5B:
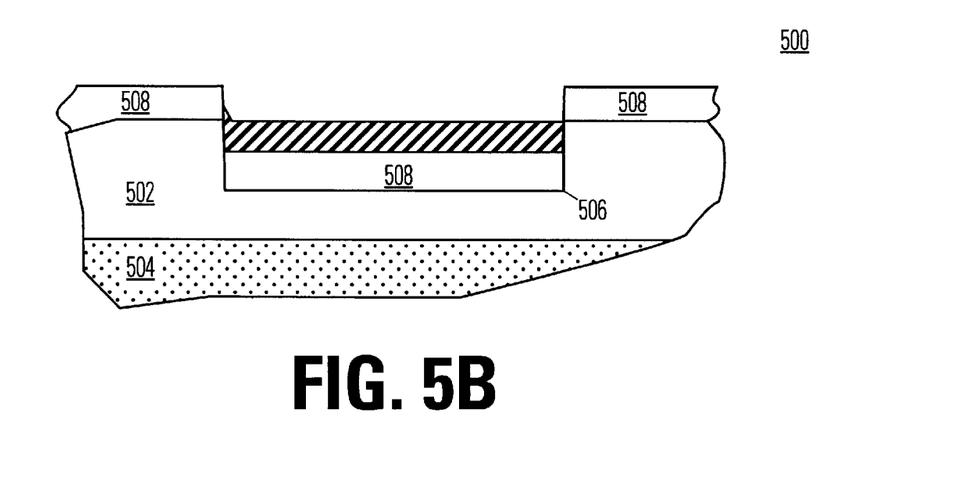
FIG. 5B is a side sectional view of the semiconductor wafer of FIG. 5A midway through a copper CMP process, in accordance with one embodiment of the present invention.

Referring now to FIG. 5B, the dynamics of the copper CMP process of semiconductor wafer 500 of FIG. 5A, similar to that of FIGS. 4A and 4B, are presented. However, one significant difference from FIGS. 4A and 4B to FIGS. 5A and 5B exist. Copper layer 508 has a thickness 516 which is less than the depth 507 of trench 506, thereby leaving space in trench 506 for a thickness 518 of polish stop layer 510. The subsequent copper CMP process removes polish stop layer 510 and copper layer 508 from high topographical areas 512 and 513, leaving both copper layer 508 and a residual portion of polish stop layer 510 within trench 506. Polish stop layer 510 provides the same protection against dishing of copper layer 508 in trench 506 as the previous. Additionally, residual polish stop layer 510 acts as a barrier layer to prevent copper layer 508 from diffusing into layers deposited above copper layer 508 following completion of the copper CMP process.

More specifically, FIG. 5B illustrates semiconductor wafer 500 midway through the copper CMP process that is well known by those of ordinary skill in the art. Initially, the polishing pad of a CMP machine typically only polishes against high topographical areas 512 and 513 of semiconductor wafer 500. However, as high topographical areas 512 and 513 are polished down, the polishing pad will eventually contact polish stop layer 510 located within trench 506. Polish stop layer located within trench 506 provides a protective layer for copper layer 508 existing within trench 506 during the copper CMP process.

Figure 5C:
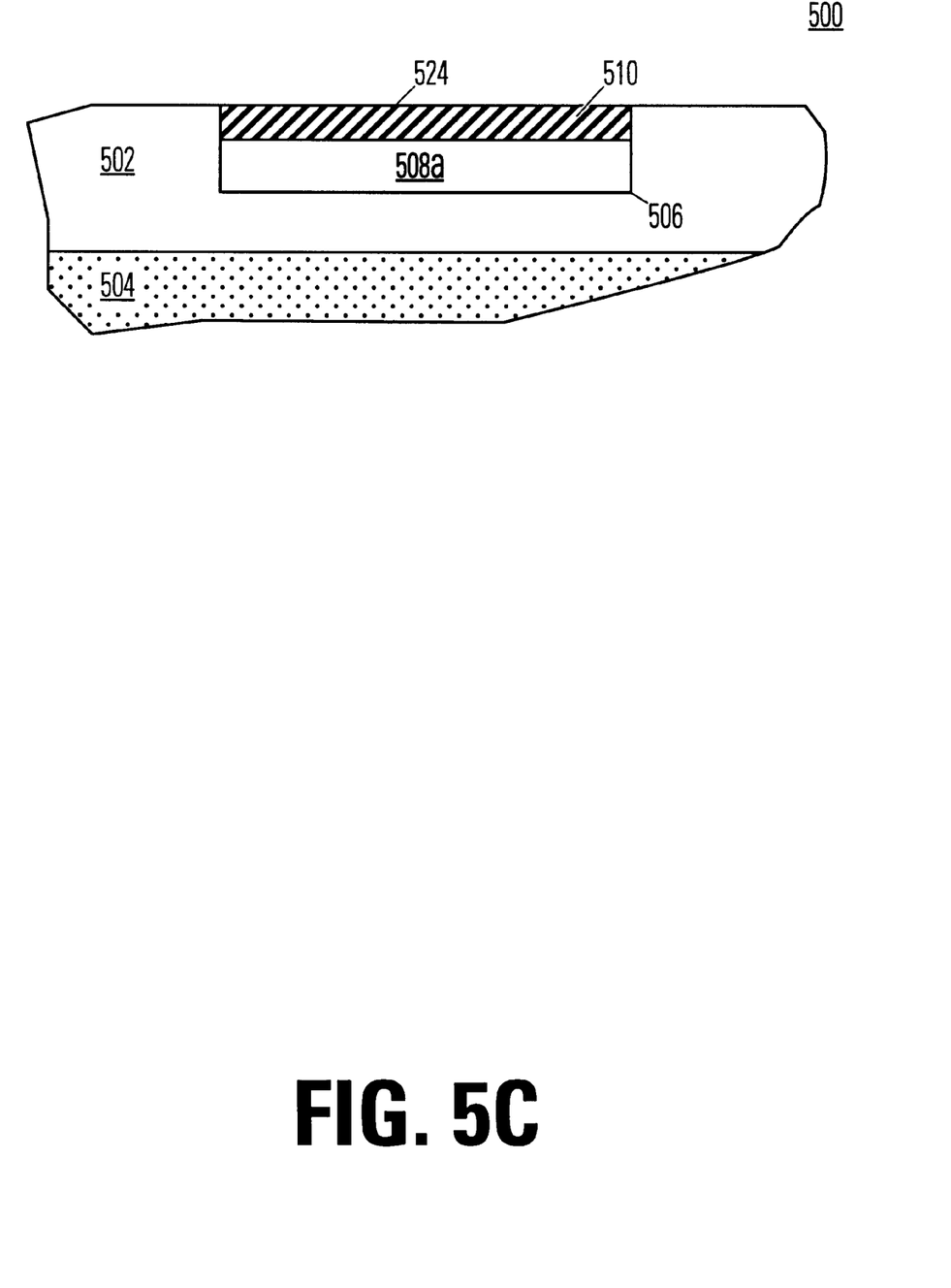

FIG. 5C presents a side sectional view of semiconductor wafer 500 after completion of copper CMP process to remove copper layer 508 and polish stop layer 510 from specific areas of semiconductor wafer 500. As shown, polish stop layer 510 has a substantially flat and non-dished surface 524. However, unlike the prior embodiment, the present embodiment maintains a portion of polish stop layer 510 over copper layer 508 inside trench 506. Like the prior embodiment, the present embodiment still produces copper line 508a with a consistent cross-sectional area that provides a constant resistance along its length. Consequently, the operation of an IC utilizing copper line 508a of the present invention has more reliable and consistent data signal transmission due to its consistent resistance. Polish stop layer 510, remaining in trench 506, acts as a barrier layer over copper line 508a thereby preventing diffusion into subsequent layers of material deposited on top of it. This aspect of the present invention provides a barrier layer without requiring additional fabrication steps.

While it is not shown in FIGS. 5A, 5B or 5C, it should be appreciated that a barrier (seed) layer of material is typically deposited on the bottom and sides of trench 506 prior to depositing copper layer 508. This barrier layer prevents copper line 508a from diffusing into dielectric layer 502.

DETAIL DESCRIPTION OF METHODS OF THE PRESENT INVENTION

Figure 6:
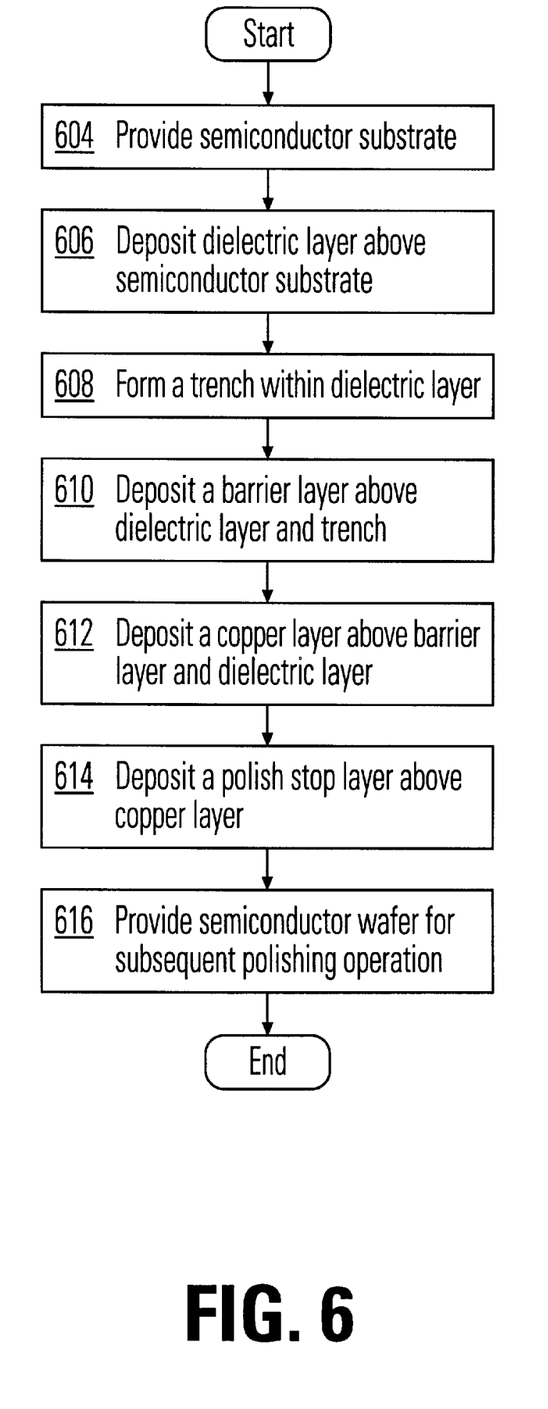
FIG. 6 is a flowchart of the steps performed in accordance with one embodiment of the present invention.

FIG. 6 is a flowchart 600, in accordance with one embodiment of the present invention, for using a polish stop film to control dishing during copper chemical mechanical polishing. Steps in this flowchart may refer to apparatus features presented in FIGS. 4 and 5 herein. In step 604, a semiconductor substrate 404 is provided for subsequent operations.

In step 606, as one embodiment in the present invention, dielectric layer 402 (as shown in FIG. 4A) is deposited above semiconductor substrate 404. The dielectric layer provides electrical insulation between the substrate and subsequent layers deposited above the dielectric layer. Within the present embodiment, it is appreciated that during step 606, the layer deposited on semiconductor substrate can be of a material other than a dielectric material.

In step 608, as one embodiment of the present invention, trench 406 (as shown in FIG. 4A) is formed into dielectric layer 402. It should be appreciated that trench 406 can have many different configurations other than that shown in FIG. 4A. It is appreciated that the present embodiment is equally suited to obtaining a planar and non-dishing surface on any surface that has an uneven topographical area. It is also appreciated that trench 406 can extend into other layers (e.g., substrate 404, etc.) as required for a design or an application. Furthermore, it is appreciated that different materials as well as additional layers besides those described herein can be utilized in the present embodiment.

In step 610 of FIG. 6, a barrier layer is deposited above dielectric layer 404. Although not shown in the Figures, it is appreciated that a barrier layer is typically deposited above dielectric layer 404 to prevent the diffusion of copper layer 408 into dielectric layer 404. While flowchart 600 contains step 610 for depositing a barrier layer, it is appreciated that a barrier layer may not be required. Typically, the barrier layer is removed from high topographical areas 412 and 413 and remains in low topographical areas 414, such as trench area 406.

In step 612, as one embodiment of the present invention, copper layer 408 (as shown in FIG. 4A) is deposited over the barrier layer and dielectric layer 402 to a desired thickness. Hence, copper layer 408 is deposited over high topographical areas 412 and 413 and over low topographical area 414. It should be appreciated that within the present embodiment, copper layer 408 can be comprised of other types of metals (e.g., aluminum, silver, and the like).

Within the present embodiment, the thickness 416 (as shown in FIG. 4A) of copper layer 408 is no less than depth 407 of trench 406 and hence completely fills trench 406. In another embodiment, thickness 516 (as shown in FIG. 5A) of copper layer 508 is less than depth 507 of trench 506 so as to provide space within trench 506 for a layer of polish stop film 510 (described below).

In step 614, polish stop layer 410 (as shown in FIG. 4A) is deposited above copper layer 408 on semiconductor wafer 400. Well-known methods in the prior art can be utilized to achieve the desired thickness of polish stop layer 410. As previously indicated, the polish stop layer follows the contour of the semiconductor wafer's surface. As a result, polish stop layer 410 is not completely planar. Instead, it generally follows the topographical contour of the surface on which it has been deposited. For example, if the surface has high topographical areas 412 and 413 and low topographical area 414, the resultant surface of polish stop layer 410 will have similarly contoured high topographical areas 412 and 413 and low topographical area 414.

It should be further appreciated that polish stop layer 410 of the present embodiment is composed of tantalum. In another embodiment, polish stop layer 410 is composed of tantalum nitride. While the present embodiment utilizes a specific material for polish stop layer 410, the present embodiment is equally suited to similar materials that exhibit polish rates less than that of copper layer 408 (or of alternative materials as specified above). Additionally, the present embodiment is also well suited to a variety of polish stop layers having a variety of thicknesses, as required for individual applications.

It should be appreciated that within the present embodiment, thickness 418 of polish stop layer 410 is approximately equal to the quotient of thickness 416 of copper layer 408 divided by a polishing selectivity value. In the embodiment of FIG. 5A, copper layer 508 is deposited to a thickness 516 which is less than depth 507 of trench 506 while polish stop layer 510 is deposited to a thickness 518. Thickness 518 is approximately equivalent to the difference between depth 507 of trench 506 and thickness 516 of copper layer 508. With the latter embodiment, polish stop layer 510 remaining within trench 506 following the copper CMP operation will act as a barrier layer to copper layer 508 formed within trench 406. It should be appreciated that the relative thickness of copper layer 508 and polish stop layer 510 can be varied over a wide range of values depending on the specific application.

In step 616, semiconductor wafer 400 is provided for subsequent copper CMP operation to remove polish stop layer 410 and copper layer 408 from high topographical areas 412 and 413, as desired.

Figure 7:
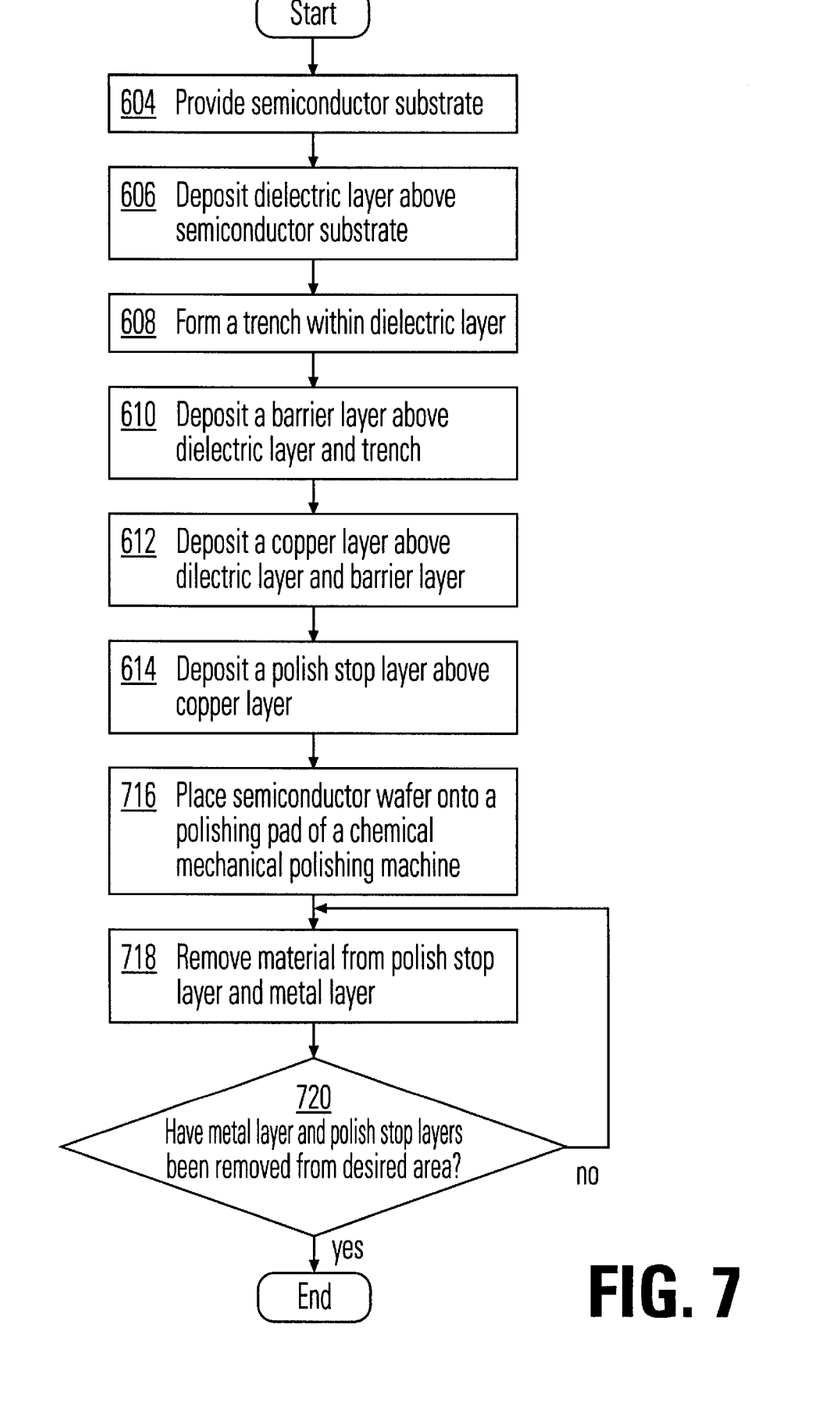
FIG. 7 is a flowchart of the steps performed in accordance with another embodiment of the present invention.

FIG. 7 is a flowchart 700 of steps, in accordance with one embodiment of the present invention, for fabricating copper lines within a semiconductor wafer which are not dished. It should be appreciated that steps 604–614 of FIG. 7 are the same as steps 604-614 of FIG. 6, previously described above.

Within step 716, semiconductor wafer 400 (as shown in FIG. 4A) is placed the onto a polishing pad of a chemical mechanical polishing (CMP) machine.

In step 718, the CMP machine begins polishing semiconductor wafer 400, thereby removing material from polish stop layer 410 and copper layer 408, initially from high topographical areas 412 and 413. The goal is to remove the material in specific areas while providing a substantially planar and non-dishing surface on the low topographical area 414. Therefore, by using a polish stop layer with the noted thicknesses and polishing selectivity values, it provides protection against dishing of the copper lines of the semiconductor wafer.

At step 720, the present embodiment determines whether the copper CMP process has removed a sufficient amount of material from polish stop layer 410 and copper layer 408 within the desired areas. If the copper CMP process has not removed a sufficient amount of material from polish stop layer 410 and copper layer 408, the present embodiment proceeds to step 718. If the copper CMP process has removed a sufficient amount of material from polish stop layer 410 and copper layer 408, the present embodiment is ended and the copper CMP process is stopped. At this point, semiconductor wafer 400 is substantially planar thanks to the protection afforded by polish stop layer 410 to the copper lines (e.g., 408*a*).

Thus, the present invention provides a method and system for providing copper lines within a semiconductor wafer that are free of dished surfaces. Furthermore, the present invention provides a method and system which meets the above need and enables encapsulation of the copper lines of the semiconductor within barrier layers without using additional fabrication steps.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for improving chemical mechanical polishing of metal deposited on a wafer in order to form metal lines, said method comprising the steps of:

(a) depositing a metal layer above a dielectric layer having a trench formed therein, said dielectric layer disposed above said wafer;

(b) depositing a polish stop layer above said metal layer;

(c) placing said wafer onto a polishing pad of a chemical mechanical polishing machine;

(d) removing material from said polish stop layer and said metal layer disposed above said dielectric layer using a single chemical mechanical polishing process, said polish stop layer reducing dishing of said metal layer located in said trench of said dielectric layer; and (e) ceasing said chemical mechanical polishing process when said polish stop layer and said metal layer only exist in said trench of said dielectric layer and said wafer is substantially planar, said polish stop layer acting as a barrier layer that encapsulates said metal layer in said trench.

2. The method as described in claim 1, wherein said step (a) comprises:

depositing said polish stop layer above said metal layer disposed on said semiconductor wafer, wherein said polish stop layer has a polishing selectivity value between 8 and 12, inclusive.

3. The method as described in claim 1, wherein said step (a) comprises:

depositing said polish stop layer above said metal layer disposed on said semiconductor wafer, wherein said polish stop layer is comprised of tantalum.

4. The method as described in claim 1, wherein step (a) comprises:

depositing said polish stop layer above said metal layer disposed on said semiconductor wafer, wherein said polish stop layer is comprised of tantalum nitride.

5. The method as described in claim 1, wherein said step (b) comprises:

depositing said polish stop layer above said metal layer, wherein said metal layer is deposited to a thickness less than a depth of said trench.

6. The method as described in claim 1, wherein said step (b) comprises:

depositing said polish stop layer above said metal layer, wherein said polish stop layer is deposited to a thickness approximately equal to a quotient of a thickness of said metal layer divided by a polishing selectivity value.

7. The method as described in claim 1, wherein said step (b) comprises:

depositing said polish stop layer above said metal layer, wherein said metal layer is deposited to a first thickness and said polish stop layer is deposited to a second thickness, wherein a sum of said first thickness and said second thickness is approximately equal to a depth of said trench.

8. The method as described in claim 1, wherein said step (a) comprises:

depositing said polish stop layer above said metal layer disposed on said semiconductor wafer, wherein said metal layer is comprised of copper.

* * * * *